(12) United States Patent
Boitnott et al.

(10) Patent No.: US 12,439,746 B1
(45) Date of Patent: Oct. 7, 2025

(54) SEAL RING WITH INNER SETBACK WALL FOR YIELD IMPROVEMENT

(71) Applicant: Apple Inc., Cupertino, CA (US)

(72) Inventors: Christopher L. Boitnott, Redwood City, CA (US); Alejandro X. Levander, El Granada, CA (US); Cheuk Chi Lo, Belmont, CA (US); Chun-Ming Tang, Saratoga, CA (US); Patrick B. Bennett, San Leandro, CA (US); Peng Xu, Santa Clara, CA (US); To C. Tan, Redwood City, CA (US); Yingkan Lin, San Jose, CA (US)

(73) Assignee: Apple Inc., Cupertino, CA (US)

( * ) Notice: Subject to any disclaimer, the term of this patent is extended or adjusted under 35 U.S.C. 154(b) by 554 days.

(21) Appl. No.: 18/047,428

(22) Filed: Oct. 18, 2022

Related U.S. Application Data

(60) Provisional application No. 63/264,891, filed on Dec. 3, 2021.

(51) Int. Cl.
*H10H 20/853* (2025.01)
*H10H 29/14* (2025.01)
*H10K 50/84* (2023.01)
*H10K 59/123* (2023.01)
*H10K 59/131* (2023.01)

(52) U.S. Cl.
CPC ........ *H10H 20/853* (2025.01); *H10H 29/142* (2025.01); *H10K 50/84* (2023.02); *H10K 59/123* (2023.02); *H10K 59/131* (2023.02)

(58) Field of Classification Search
CPC ..... H10K 59/131; H10K 50/84; H10K 59/123
USPC .......................................................... 257/79
See application file for complete search history.

(56) References Cited

U.S. PATENT DOCUMENTS

| | | |
|---|---|---|
| 10,134,904 B2 | 11/2018 | Adachi et al. |
| 10,405,438 B2 | 9/2019 | Lee et al. |
| 2017/0373128 A1* | 12/2017 | Lee ............... H10K 59/131 |
| 2020/0110525 A1* | 4/2020 | Park ............... H10K 59/88 |
| 2021/0288130 A1* | 9/2021 | Kim ............... H10K 71/70 |

* cited by examiner

*Primary Examiner* — Xia L Cross
(74) *Attorney, Agent, or Firm* — Aikin & Gallant, LLP

(57) ABSTRACT

Display panels and methods of fabrication are described which a seal ring is formed within a build-up structure over a semiconductor substrate. The seal ring may include an outer perimeter wall and an inner setback wall spaced apart from the outer perimeter wall and directly underneath a contact ledge of the display panel.

21 Claims, 5 Drawing Sheets

SEAL RING WITH INNER SETBACK WALL FOR YIELD IMPROVEMENT

RELATED APPLICATIONS

This application claims the benefit of priority of U.S. Provisional Application No. 63/264,891 filed Dec. 3, 2021 which is incorporated herein by reference.

BACKGROUND

Field

Embodiments described herein relate to display panels.

Background Information

Display devices, and in particular display devices that may be partially bent have been observed to be susceptible to crack formation which can lead to malfunction of the display devices. For example, organic light emitting diode (OLED) display devices are self-emitting and do not require a separate light source like a liquid crystal display (LCD) display device. As such, OLED display devices can be formed using thin film techniques on a relatively thin and flexible substrate.

In a traditional OLED stack-up a multi-layer thin film stack is formed over a base substrate to form thin film transistor (TFT) circuitry and wiring. This multi-layer stack-up may span across both a display area and non-display area of the base substrate. Various emission layers, including the organic emission layers can be formed over the display area, following by deposition of top encapsulation layer(s) over the display area and non-display area to seal the underlying layers and protect the organic emission layers from atmospheric conditions. In some implementations, crack prevention layers can be formed as part of the TFT stack-up or on top of the TFT stack-up in the non-display area to prevent cracks originating at the interface of dissimilar materials with dissimilar patterns from propagating into the display area.

SUMMARY

Display panels and methods of fabrication are described. In an embodiment, a display panel includes a semiconductor substrate, a plurality of devices formed in a die area of the semiconductor substrate, and a build-up structure over the semiconductor substrate, the build-up structure including pixel wiring connected with the die area and a seal ring laterally surrounding the pixel wiring. An emission layer including an array of light emitting diodes (LEDs) is located on the build-up structure and connected with the pixel wiring, a cover layer is located over the emission layer such that the cover layer is not directly over a contact ledge of the build-up structure. In accordance with embodiments, the contact ledge spans directly over a portion of the seal ring, and the seal ring includes an outer perimeter wall and an inner setback wall spaced apart from the outer perimeter wall directly underneath the contact ledge.

DETAILED DESCRIPTION

Figure 1:
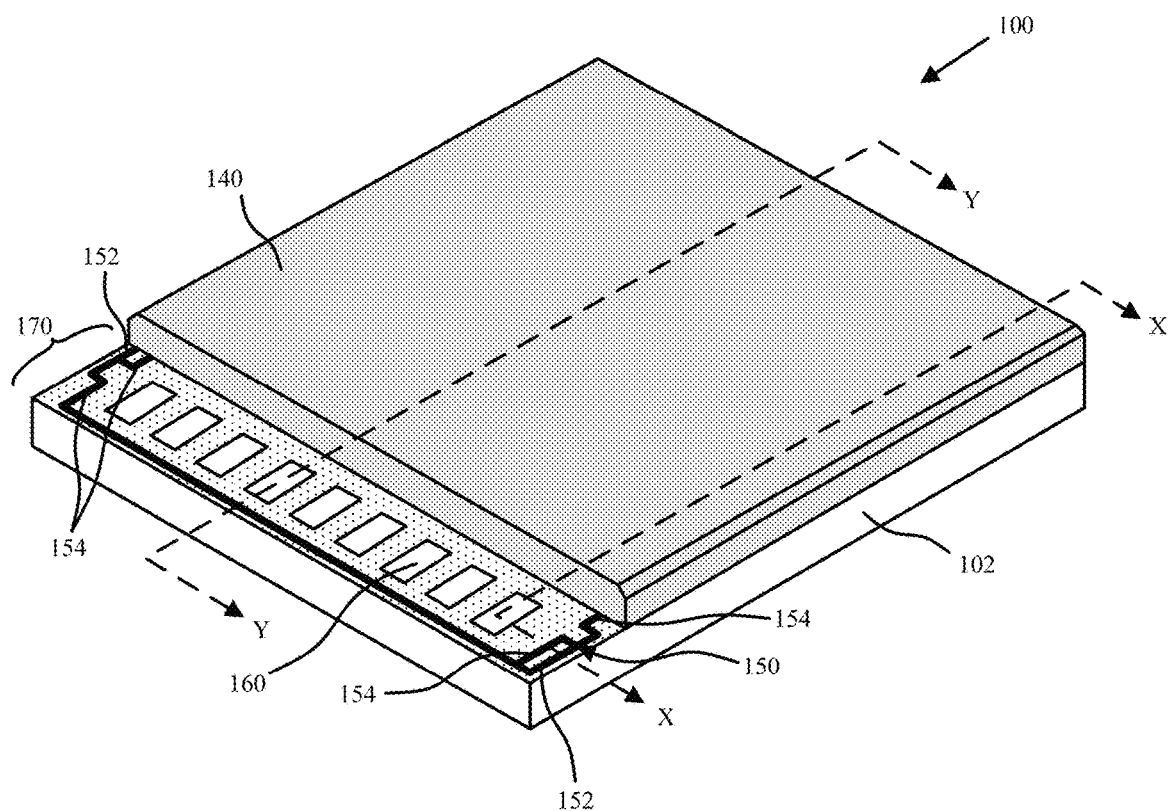
FIG. 1 is a schematic perspective view illustration of a display panel including a seal ring with outer perimeter wall and inner setback wall in accordance with an embodiment.

Embodiments describe display panels and methods of manufacture in which a seal ring is formed within a build-up structure over a semiconductor substrate. In particular, the seal ring includes an outer perimeter wall adjacent a perimeter of the semiconductor substrate, and an inner setback wall spaced apart from the outer perimeter wall. The inner setback wall in accordance with embodiments may be located underneath a contact ledge of the display panel near a high-risk point such as a singulated edge, corner, or bonding ledge to provide protection from edge defects. For example, the increased setback distance may potentially accommodate larger defects, or chips at the edges. The seal ring structures in accordance with embodiments may have a single wall layout, where the inner setback wall extends from the outer perimeter wall, or as a multiple wall layout where the inner setback wall is interior to or laterally surrounded by the outer perimeter wall. In either configuration, the inner setback wall may be contiguous with the outer perimeter wall.

In one aspect, embodiments describe display panels formed using metal-oxide-semiconductor-field-effect-transistor (MOSFET) fabrication techniques on semiconductor substrates (e.g. silicon). In accordance with embodiments, it has been observed that the tendency to generate edge defects is not uniform around the perimeter edges of the display panel, and specific areas such as corners or exposed contact ledges can be considered high-risk points. Accordingly, the display panels in accordance with embodiments may be designed to balance the goals of achieving optimal die yield from a wafer with minimum possible edge dimensions and street width between adjacent scribe areas, and without compromising the natural protection of critical structures from such edge defects.

In accordance with embodiments, display panels and methods of manufacture are described in which a seal ring including an inner setback wall is formed within a build-up structure over a semiconductor substrate. Specifically, an inner setback wall can be shifted internally along an exposed ledge where edge defects, such as chips, can occur more frequently and be relatively large. This shift may increase the allowance for large chips and in turn enhance production yield without requiring an increase in edge dimensions. The inner setback wall may be moved internally from the outer metallic sealing substrate, such as at least 75 μm or at least 100 μm, such as 100-200 μm, or 100-150 μm. In such a configuration, the seal ring arrangement may terminate stress propagation of edge chips or blisters that may be initiated by dicing process or handing and assembly and preserve critical device structures. The seal rings in accordance with embodiments may additionally provide a barrier to moisture and oxygen ingress through interlayer dielectric materials such as low dielectric constant (low-k) materials.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 2:
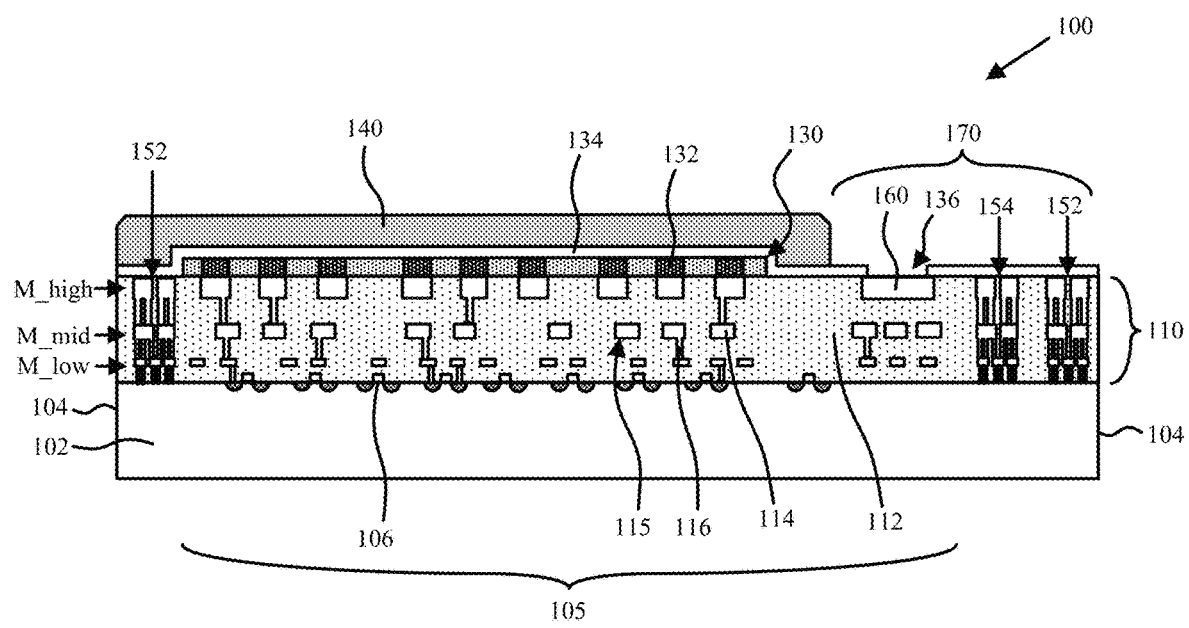
FIG. 2 is a schematic cross-sectional side view illustration of a display panel taken across section X-X of FIG. 1 in accordance with an embodiment.

Referring now to FIGS. 1-2, FIG. 1 is a schematic perspective view illustration of a display panel 100 including a seal ring 150 with outer perimeter wall 152 and inner setback wall 154 in accordance with an embodiment; FIG. 2 is a schematic cross-sectional side view illustration of a display panel 100 taken across section X-X of FIG. 1 in accordance with an embodiment. As shown, the display panel 100 includes a semiconductor substrate 102, such as a silicon substrate or silicon-on-insulator (SOI) substrate, and a plurality of devices 106 formed in a die area 105 of the semiconductor substrate 102. The devices 106 may be a variety of devices, such as passive devices and active devices such as metal-oxide-field-effect-transistors (MOSFETs). In accordance with embodiments, a build-up structure 110 is formed over the semiconductor substrate 102 and includes pixel wiring 115 connected with the die area 105 and a seal ring 150 laterally surrounding the pixel wiring 115.

The build-up structure 110 may be fabricating using conventional back-end-of-the-line (BEOL) materials including metal wiring layers 114 (e.g. copper, aluminum, etc.) and insulating interlayer dielectrics (ILD) 112 such as oxides (e.g. silicon oxide, carbon doped oxides, etc.), nitrides (e.g. silicon nitride), low-k, materials, etc. and vias 116 connecting adjacent levels of the metal wiring layers 114. In accordance with embodiments, the routings for pixel wiring 115 and the seal ring 150 can be formed within the lower metal layers M_low, upper metal layers M_high, midlevel metal layers M_mid, and combinations thereof, and may include damascene interconnects. While only three metal layers are illustrated, this is merely for illustrational purposes and a larger number of metal layers may be included. Generally, the lower metal layers M_low have finer line widths, thickness and spacing. Thus, the build-up structure 110 may include metal wiring layers 114 with different line widths, thicknesses and spacing, all of which may increase from lower metal layers to the upper metal layers. In accordance with embodiments, the seal ring 150 is formed from the metal wiring wirings 114 and vias 116 used to create the pixel wiring 115, and thus may include a stack of multiple metal layers.

As shown in FIG. 2, the display panel 100 additionally includes an emission layer 130 that includes an array of light emitting diodes (LEDs) 132 on the build-up structure 110 and connected with the pixel wiring 115. The LEDs 132 may be suitable emissive LEDs such as organic light emitting diodes (OLEDs) or inorganic semiconductor-based LEDs such as micro LEDs. The emission layer 130 may include a multiple layer stack depending upon types of LEDs. For example, and OLED emission layer 130 may include pixel defining layers, organic emission layers, top electrode layers, etc. A micro LED emission layer may include an encapsulation layer to secure the micro LEDs 132 onto the build-up structure 110 and provide step coverage for overlying top electrode layers, etc. A cover layer 140 can additionally be provided over the emission layer 130. The cover layer 140 can include a plurality of layers including polarizers, cover glass, etc. In accordance with embodiments, the cover layer 140 is not directly over a contact ledge 170 of the build-up structure 110. The cover layer 140 may additionally one or more shared edges 104 with the semiconductor substrate 102. For example, the shared edges 104 may be cut or sawed along with the semiconductor substrate 102 and build-up structure 110 during a dicing operation.

A blanket passivation layer 134 may be formed over the emission layer 130 and any portion of the build-up structure 110 not covered by the emission layer 130 to provide a sealed box structure to block moisture ingress, ion diffusion, oxidation etc. and protect sensitive layers from environment. The seal ring may extend all the way from the semiconductor substrate 102 to the passivation layer 134 to complete the sealed box. In an embodiment, the passivation layer 134 spans underneath the cover layer 140. The passivation layer 134 may include one or more layers of suitable materials such as inorganics (e.g. silicon, nitrides, carbides, oxides) as well as some polymers (e.g. polymers for more tolerant devices or applications). In accordance with embodiments, a plurality of openings 136 is formed in the passivation layer 134 exposing a plurality of contact pads 160 on a contact ledge 170 of the build-up structure 110. The contact ledge 170 and contact pads 160 can be designed to receive any combination of chips or flex circuits, similar to chip on glass (COG) and film on glass (FOG) display assemblies. In accordance with embodiments, the contact ledge 170 spans directly over a portion of the seal ring 150, and specifically over a portion of the seal ring including an outer perimeter wall 152 and an inner setback wall 154 that is spaced apart from the outer perimeter wall 152 and directly underneath the contact ledge 170. The seal rings 150 in accordance with embodiments may guard against microcracking, delamination, moisture ingress, ion diffusion, etc. toward a die area even when adjacent a scribed edge of the semiconductor substrate 102 and build-up structure 110.

Figure 3A:
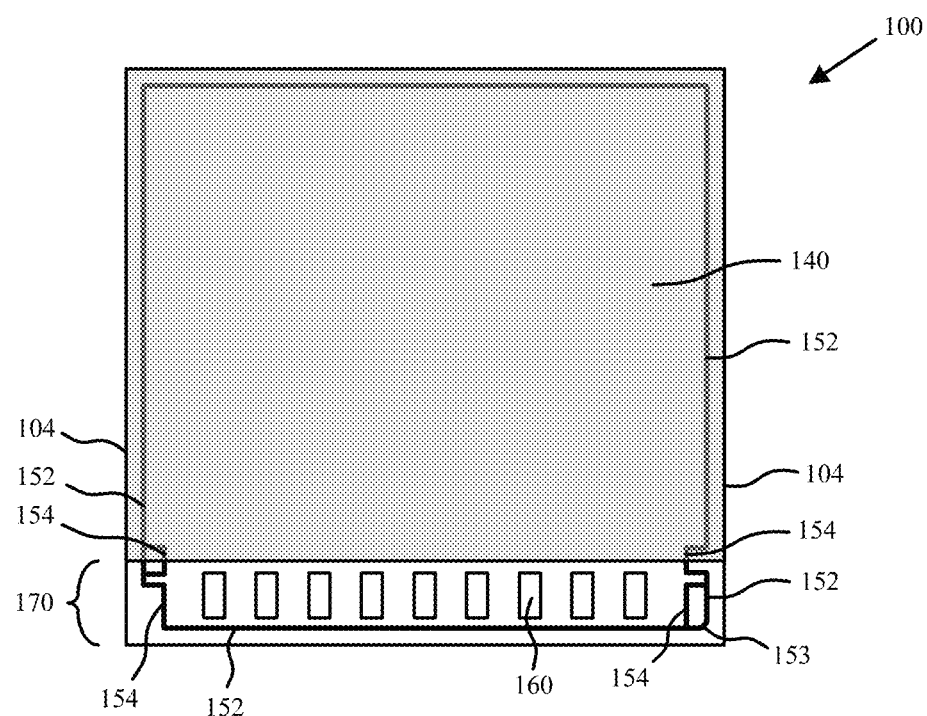
FIG. 3A is a schematic top view illustration of a display panel including a seal ring with outer perimeter wall and inner setback wall in accordance with an embodiment.
Figure 3B:
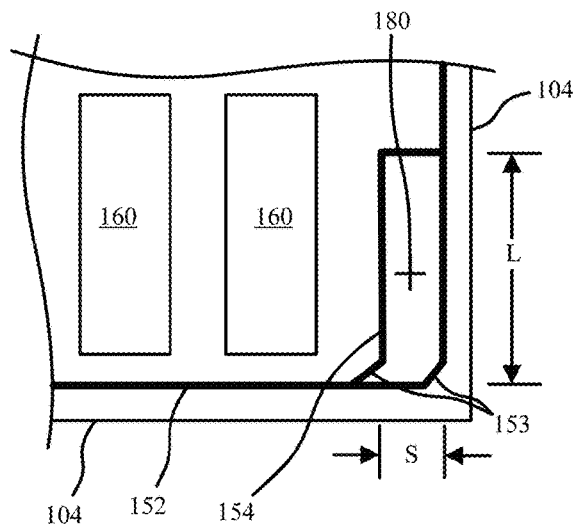
FIGS. 3B-3C are close-up schematic top view illustrations of a seal ring with inner setback wall interior to and surrounded by an outer perimeter wall located adjacent a corner of a display panel in accordance with embodiments.
Figure 3C:
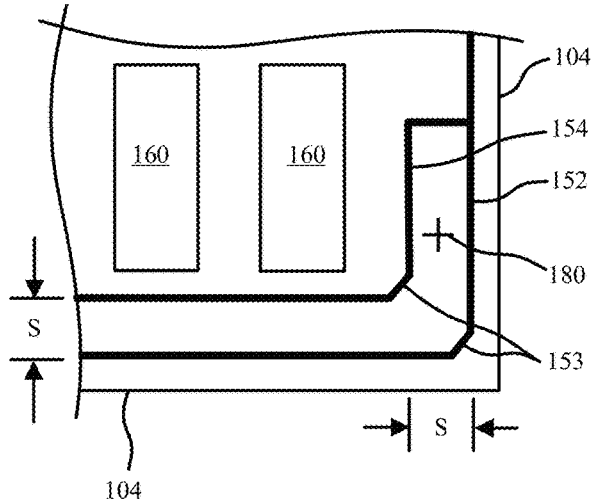
Figure 3D:
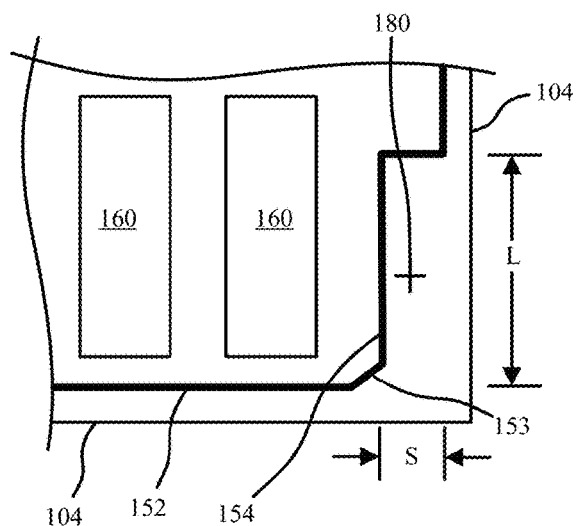
FIGS. 3D-3E are close-up schematic top view illustrations of a seal ring with inner setback wall located adjacent a corner of a display panel in accordance with embodiments.
Figure 3E:
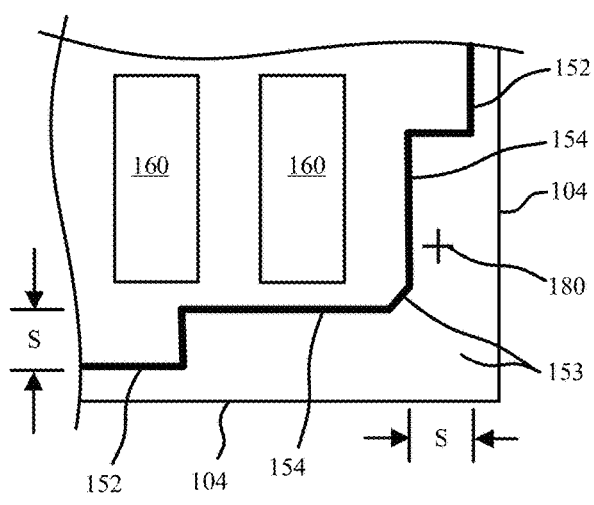

Referring now to FIGS. 3A-3E, FIG. 3A is a schematic top view illustration of a seal ring 150 with inner setback wall 154 interior to and surrounded by an outer perimeter wall 152 in accordance with an embodiment; FIGS. 3B-3C are close-up schematic top view illustrations of a seal ring 150 with inner setback wall located adjacent a corner of a display panel 100 in accordance with embodiments; FIGS. 3D-3E are close-up schematic top view illustrations of a seal ring with inner setback wall located adjacent a corner of a display panel in accordance with embodiments.

In accordance with embodiments, the inner setback wall 154 is laterally spaced from the outer perimeter wall 152 by a spacing (S) sufficient to absorb defects or chipping that may occur at high-risk areas. For example, the inner setback wall 154 is laterally spaced from the outer perimeter wall 152 by a spacing (S) of at least 75 µm, such as 100-200 µm. Location and design of the seal rings 150 in accordance with embodiments however also facilitate achieving minimum possible edge dimensions. As such, the inner setback walls 152 can be strategically located at high-risk points so as to not substantially require an increase in dimensions. In the particular embodiments illustrated in FIGS. 3A-3E the inner setback wall 154 is located adjacent an edge or corner of the semiconductor substrate 102 and overlying build-up structure 110 of the display panel 100. The inner setback walls 154 can also be located at select locations along a single edge 104. The display panel may include multiple discrete inner setback walls 154 that are separate from one another. Additionally, critical wiring or devices may be moved away from high-risk areas. A variety of possible locations are illustrated in FIG. 3A, including an inner setback wall adjacent one or more edges 104 and corner of the semiconductor substrate 102. In an embodiment, an inner setback wall spans underneath a portion of the contact ledge 170 as well as underneath a portion of the cover layer 140. In some embodiments, areas designed to accommodate the additional inner setback walls 154 can also include fiducial marks 180 to aid with processing. For example, a fiducial mark 180 may at least partially overlap spacing (S) or offset distance from the outer perimeter wall 152 to the inner setback wall 154. Similarly, test structures can be arranged in this area, separated from the critical inner device structures by the inner setback wall 154, and may be fully enclosed in a multiple wall seal ring structure.

As shown in FIG. 3A, in some embodiments a contour of the outer perimeter wall 152 may substantially match a shape, or contour, of the semiconductor substrate 102 perimeter edges 104. For example, the outer perimeter wall 152 may be uniformly offset by a certain distance from the perimeter edges 104. Minor variations of contour may be included. For example, the outer perimeter wall 152 may include a kerf 153 adjacent a corner of the semiconductor substrate 102 in order to increase resistance to defect propagation. Kerfs 153 may also be included with the inner setback walls 154.

Referring now to FIG. 3B, in an embodiment an inner setback wall 154 can include a longitudinal length (L) parallel to an edge 104 of the semiconductor substrate 102. For example, the inner setback wall 154 can form a rectangular shape with the outer perimeter wall, including a longest edge with the longitudinal length (L). In the illustrated embodiment the inner setback wall 154 is contiguous with the outer perimeter wall 152. The seal ring 150 illustrated in FIG. 3B includes a double wall structure in which the inner setback wall 154 is surrounded by the outer perimeter wall 152. The seal ring 150 illustrated in FIG. 3D includes a single wall structure in which the inner setback wall 154 is not surrounded by the outer perimeter wall 152. Additional multi-wall configurations are envisioned, with more than two walls.

The seal rings 150 in accordance with embodiments may include a variety of shapes other than rectangular, such as an L-shape as shown in FIG. 3C (double wall) and FIG. 3E (single wall) that wraps around a corner of the semiconductor substrate 102 and includes a longitudinal length spanning along two edges 104. It is to be appreciated that while the longitudinal length (L) is illustrated with regard to an inner setback wall 154 adjacent a corner, a discrete inner setback wall 154 along any edge 104 may be characterized by a longitudinal length (L), for example spanning underneath the cover layer 140 as shown in FIG. 3A.

Figure 4:
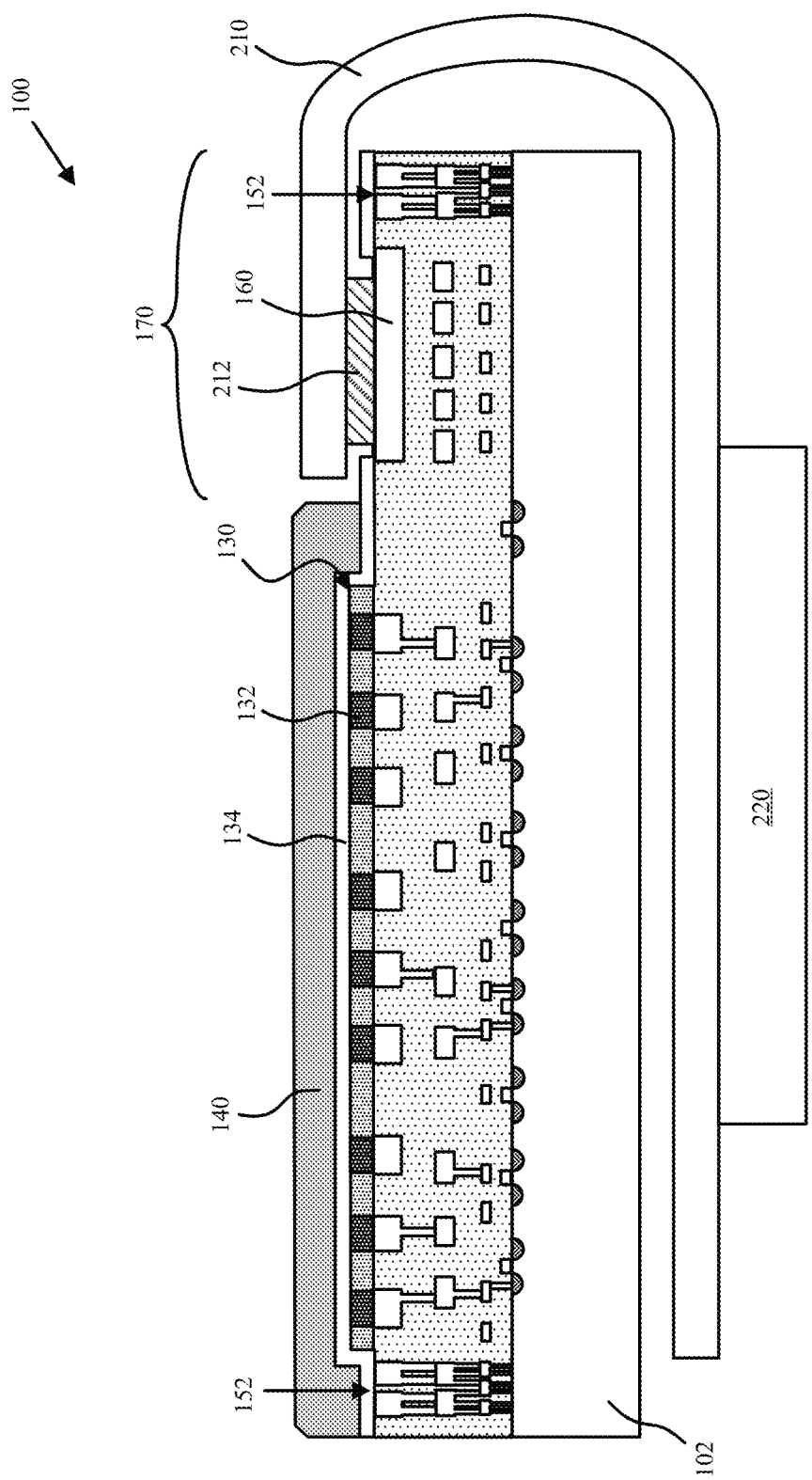
FIG. 4 is a schematic cross-sectional side view illustration of a display panel with a flex circuit attached to a contact ledge in accordance with an embodiment.
Figure 5:
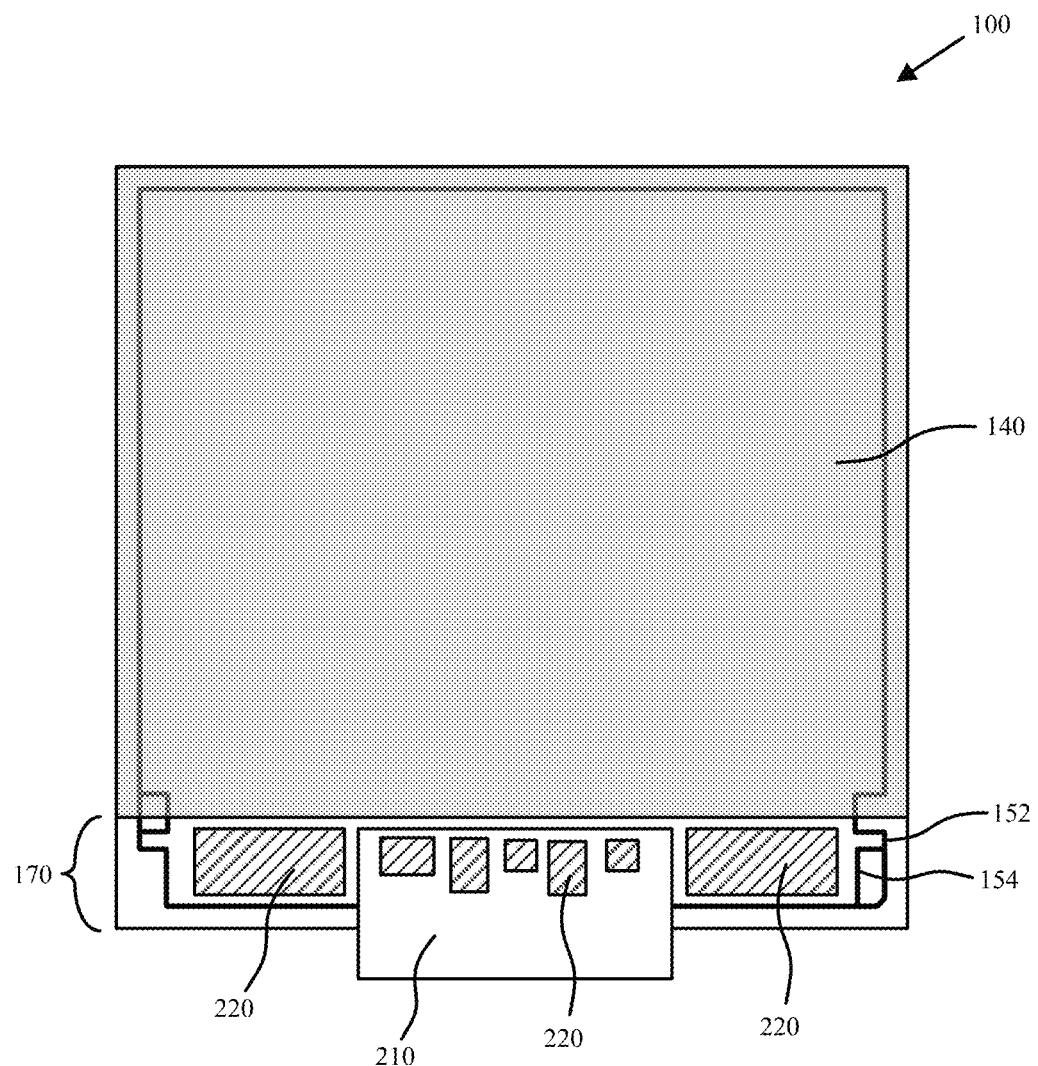
FIG. 5 is a schematic top view illustration of a display panel with one or more chips and flex circuit attached to a contact ledge in accordance with an embodiment.

Referring now to FIG. 4, a schematic cross-sectional side view illustration is provided of a display panel 100 with a flex circuit 210 attached to a contact ledge 170 in accordance with an embodiment. Specifically, the schematic cross-sectional side view illustration is taken across section Y-Y of FIG. 1 after attaching the flex circuit 210. The flex circuit 210 can be bonded to the plurality of contact pads 160 on the contact ledge 170 using a variety of suitable bonding materials 212 such as one or more anisotropic conducting films (ACFs), solder bumps, etc. Additionally, one or more chips 220 (e.g. timing control, display drivers, power supply, etc.) can be mounted on the flex circuit 210 to communicate with the pixel wiring 115 and operate the display panel 100. In the embodiment illustrated in FIG. 4 one or more chips 220 are mounted onto a portion of the flex circuit 210 that is folded around a back side of the semiconductor substrate 102. Chips 220 may also be bonded to other locations, such as directly onto a portion of the plurality of contact pads 160 on the contact ledge 170 or onto a flex circuit 210, and directly over the contact ledge 170 as shown in FIG. 5. In accordance with embodiments, the seal ring 150, and strategic location of the inner setback walls 154 at high-risk areas may improve overall fabrication yield to protect against defects and chipping that may occur along edges or corners of the display panel, particularly along the thinner contact ledge 170 during fabrication sequences, such as equipment handling during fabrication of the emission layer 130, placement of the cover layer 140, bonding of the chips 220 and/or flex circuit 210, etc.

In utilizing the various aspects of the embodiments, it would become apparent to one skilled in the art that combinations or variations of the above embodiments are possible for forming display panel with seal ring. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:
1. A display panel comprising:
   a semiconductor substrate;
   a plurality of devices formed in a die area of the semiconductor substrate;
   a build-up structure over the semiconductor substrate, the build-up structure including pixel wiring connected with the die area, and a seal ring laterally surrounding the pixel wiring;
   an emission layer including an array of light emitting diodes (LEDs) on the build-up structure and connected with the pixel wiring; and
   a cover layer over the emission layer, wherein the cover layer is not directly over a contact ledge of the build-up structure;
   wherein the contact ledge spans directly over a portion of the seal ring including an outer perimeter wall adjacent a perimeter edge of the semiconductor substrate and an inner setback wall that is shifted internally from the perimeter edge relative to the outer perimeter wall.

2. The display panel of claim 1, wherein the plurality of devices is a plurality of metal-oxide-semiconductor-field-effect-transistors (MOSFETs).

3. The display panel of claim 2, wherein the build-up structure includes damascene interconnects.

4. The display panel of claim 3, wherein the seal ring includes multiple stacked metal layers.

5. The display panel of claim 4, wherein the inner setback wall is laterally spaced from the outer perimeter wall by at least 75 µm.

6. The display panel of claim 4, wherein the inner setback wall is laterally spaced from the outer perimeter wall by 100-200 µm.

7. The display panel of claim 4, wherein the inner setback wall is located adjacent a corner of the semiconductor substrate.

8. The display panel of claim 4, wherein the inner setback wall includes a longitudinal length parallel to an edge of the semiconductor substrate.

9. The display panel of claim 4, wherein the inner setback wall partially spans underneath the cover layer.

10. The display panel of claim 4, further comprising a second inner setback wall separate from the inner setback wall.

11. The display panel of claim 4, wherein a contour of the outer perimeter wall substantially matches a shape of the semiconductor substrate perimeter edges.

12. The display panel of claim 4, wherein the contour of the seal ring comprises a kerf adjacent a corner of the semiconductor substrate.

13. The display panel of claim 4, wherein the inner setback wall is contiguous with the outer perimeter wall.

14. The display panel of claim 4, further comprising a blanket passivation layer spanning over the array of LEDs and the contact ledge, and a plurality of openings in the passivation layer exposing a plurality of contact pads on the contact ledge.

15. The display panel of claim 14, further comprising a flex circuit bonded to the plurality of contact pads on the contact ledge.

16. The display panel of claim 15, wherein the flex circuit is folded around a back side of the semiconductor substrate.

17. The display panel of claim 15, further comprising a chip bonded to a portion of the plurality of contact pads on the contact ledge.

18. The display panel of claim 4, further comprising a fiducial mark that at least partially overlaps space between the outer perimeter wall and the inner setback wall.

19. The display panel of claim 1, wherein the inner setback wall is contiguous with the outer perimeter wall.

20. The display panel of claim 19, wherein the seal ring is a single wall structure in which the inner setback wall is not surrounded by the outer perimeter wall.

21. The display panel of claim 19, wherein the seal ring is a multiple wall structure in which the inner setback wall is surrounded by the outer perimeter wall.

* * * * *